United States Patent

[11] 3,596,348

[72] Inventors Michael Albert Stacey
Solihull;
Michael Searle, Sutton Coldfield, both of, England

[21] Appl. No. 804,083
[22] Filed Mar. 4, 1969
[45] Patented Aug. 3, 1971
[73] Assignee Joseph Lucas (Industries) Limited
Birmingham, England
[32] Priority Mar. 15, 1968
[33] Great Britain
[31] 10608/68

[54] THYRISTORS AND OTHER SEMICONDUCTOR DEVICES
6 Claims, 3 Drawing Figs.

[52] U.S. Cl. ........................................................ 29/583, 29/590
[51] Int. Cl. ........................................................ B01j 17/00, H01l 7/66
[50] Field of Search ........................................... 29/589, 590, 591, 583, 571; 156/17

[56] References Cited

UNITED STATES PATENTS

| | | | |
|---|---|---|---|
| 3,054,709 | 9/1962 | Freestone et al. ............ | 29/583 |
| 3,288,662 | 11/1966 | Weisberg...................... | 156/11 |
| 3,468,017 | 9/1969 | Stacey et al................... | 29/590 |

*Primary Examiner*—John F. Campbell
*Assistant Examiner*—W. Tupman
*Attorney*—Holman & Stern

ABSTRACT: Thyristors are produced starting with an N-type wafer and forming P-type layers on opposite sides to act as the anodes and gates of the thyristors. N-type layers acting as the cathodes are then produced in or on the plate layers, after which the wafer is coated with nickel and then with gold, and gold is removed from at least part of the portion of each gate-cathode junction which is exposed in the surface of the wafer. The wafer is then divided into chips by cracking or sawing, and the cracked or sawn junctions are then improved by etching, the etching at the same time removing the nickel from the junctions exposed by the removal of the gold. A similar process is applied to manufacture transistors.

Figures 1, 2:
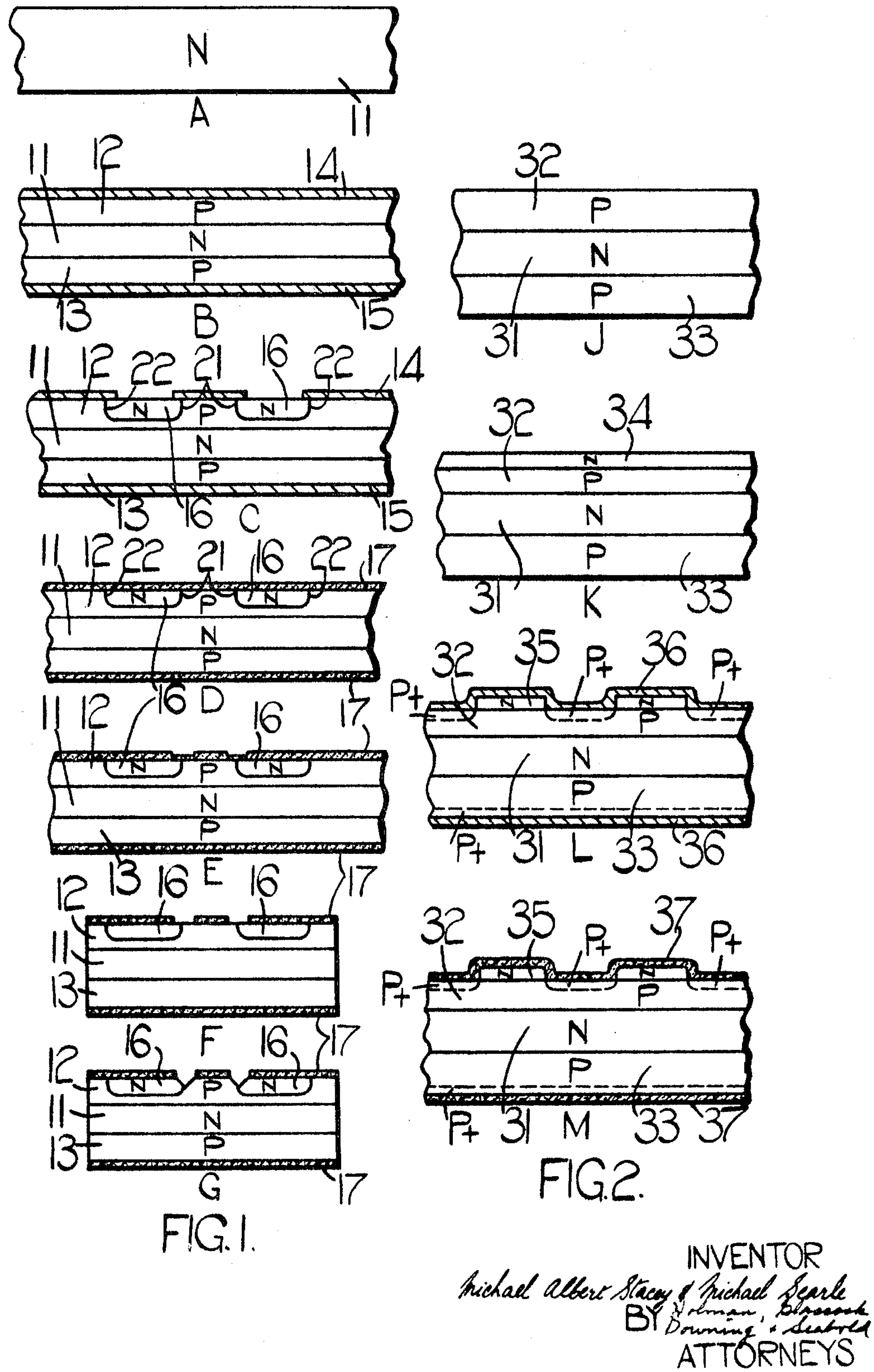

INVENTOR
Michael Albert Stacey & Michael Searle
BY Holman, Glascock, Downing & Seebold
ATTORNEYS INVENTOR
Michael Albert Stacey & Michael Searle
BY Holman, Glascock, Downing & Seebold
ATTORNEYS

THYRISTORS AND OTHER SEMICONDUCTOR DEVICES

This invention relates to a method of manufacturing thyristors and other semiconductor devices.

A method according to the invention includes the following steps:

a. producing a semiconductor wafer having a first zone exposed on one surface of the wafer, a second zone exposed on the other surface of the wafer, and a plurality of third zones in or on said second zone and also exposed on said other surface of the wafer, b. plating the water first with nickel and then with gold, c. removing the gold from at least part of each of the junctions between the second zone and the third zones, d. dividing the wafer at positions between the third zones, either by scribing and cracking or by sawing, into a plurality of chips each of which contains one of said third zones, e. etching the chips using an etchant which does not remove gold but does remove the nickel from the parts of said junctions of each chip exposed at stage (c), the etchant further serving to etch the sawn or cracked edge of each chip, f. making contacts to the gold layers on the first, second and third zones.

The accompanying drawings are flow sheets illustrating three examples of the invention, the various stages in the process being indicated on the drawing and corresponding to the stages indicated in the following description.

Referring first to FIG. 1, the process is as follows:

STAGE A

A wafer 11 of N-type silicon having a resistivity of 25 ohms per centimeter is polished on its top surface.

STAGE B

The wafer 11 is placed in a furnace at 1,050° C., and boron passed through the furnace for 5 minutes. The source of boron is then removed, and replaced by a mixture of oxygen and nitrogen at 1,250° C. for 10 hours. This process forms P-type layers 12, 13 on opposite sides of the N-type layer, together with layers 14, 15 of silicon dioxide approximately 7,000 A° thick. In use the layers 12, 13 will constitute the gates and anodes respectively of a plurality of thyristors.

STAGE C

Windows are cut in the oxide layer 14 by conventional photolithography techniques. The N-type cathode layers 16 of the thyristors to be formed are then formed by placing the wafer in a furnace at 1,150° C. and diffusing phosphorus for 2 minutes, followed by a period of 150 minutes at 1,200° C. in an atmosphere of oxygen. This process will thicken the layers 14, 15. In the example shown, each cathode layer 16 is of generally annular form and the portion of the gate-cathode junction exposed on the upper surface of the wafer has an inner minor portion 21 and an outer, major portion 22. There will of course be a large number of cathode-layers 16 on the wafer, although only one complete cathode layer and part of another is seen in the drawing.

STAGE D

The oxide layers 14, 15 are removed by etching in hydrofluoric acid, and the wafer is nickel plated sintered at 800° C., nickel plated again, and then gold plated on both its upper and lower surfaces, the plating being indicated at 17.

STAGE E

Photo masking techniques are used to protect both the upper and lower surfaces of the wafer except for the portions 21 of the gate-cathode junctions, which are left exposed. The wafer is then etched in potassium iodide for 3 minutes to remove the gold from the exposed portions 21 of the junctions.

STAGE F

The wafer is separated into individual chips by either leaving the wafer on the slide and sawing into the separate chips, or removing the wafer from the slide and cleaning off the masks following which the wafer is scribed and cracked.

STAGE G

The process at stage F tends to damage the junctions, indicated at J1 and J2, between the original N-type wafer and the gates and anodes, and in order to obtain good voltage blocking characteristics for the finished thyristor, the junctions are etched for 30 seconds in a mixture of nitric acid and hydrofluoric acid. This etching process also removes all traces of nickel from the portion 21 of the gate-cathode junction, but the etchant does not attack the gold.

The final process is to make anode, cathode and gate contacts to the gold layers in the usual way. The overall process is considerably simplified as compared with known techniques for producing thyristors, and consequently enables a cheaper thyristor to be manufactured.

Referring now to FIG. 2, stage A is not shown but is the same as stage A in FIG. 1. The process proceeds as follows:

STAGE J

Aluminum is diffused into an N-type wafer 31 at 1,250° C. under vacuum for 1 hour. The vacuum is then broken and the slices maintained in the furnace for a further 4 hours at 1,250° C. after which it is slow cooled. This process leaves *p*-type layers 32, 33 in the wafer 31, together with a glass covering which is then removed by etching.

STAGE K

Phosphorus is diffused at 1,250° C. for 20 minutes into both sides of the wafer to form an N-type layer 34 on the top surface of the wafer, together with an N-type layer on the lower surface of the slice, this layer, together with the glass layers formed, being removed in conventional manner by masking and etching.

STAGE L

The slice is etched using photolithographic techniques to define N-type cathode mesas 35. A P-type impurity is then diffused into the slice by known techniques, for example using boron at 1,200° C. for two hours followed by a slow cooling process. This impurity increases the concentration of P-type impurity at the surface of the layer 32, and decreases the concentration of the mesas 35. However, the N-concentration of the mesas is chosen to compensate for this decrease. The glass layers formed at this stage are shown at 36.

STAGE M

Hydrofluoric acid is used to remove the layers 36, following which the device is subjected to nickel and gold plating processes the plating being shown at 37.

The remaining stages are the same as stages E, F and G in FIG. 1.

Figure 3:
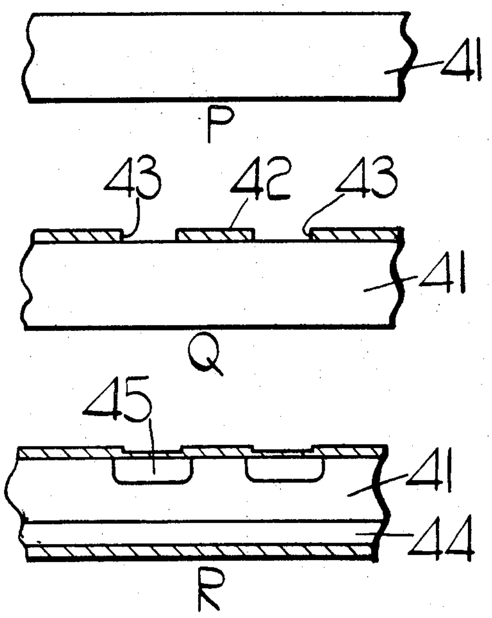

FIG. 3 shows an example as applied to the manufacture of NPN transistors.

STAGE P

The process starts with a P-type wafer 41 which is to act as the base of each transistor to be produced.

STAGE Q

An oxide mask 42 is grown on the top surface of the wafer by conventional techniques, leaving windows 43 in the mask.

STAGE R

An N-type impurity is diffused into the lower surface of the wafer to produce a zone 44 which is to act as the collector, the impurity also diffusing through the window to produce N-type emitter zones 45.

The remaining stages are the same as stages D onwards in FIG. 1, and it will be appreciated that the structure shown at R could be produced by the mesa technique described with reference to FIG. 2.

Having thus described our invention what we claim as new and desire to secure by Letters Patent is:

1. A method of manufacturing semiconductor devices, including the following steps:

a. producing a semiconductor wafer having a first zone exposed on one surface of the wafer, a second zone exposed on the other surface of the wafer, and a plurality of third zones in or on said second zone and also exposed on said other surface of the wafer, b. plating the wafer first with nickel and then with gold, c. removing the gold from at least part of each of the junctions between the second zone and the third zones, d. dividing the wafer at positions between the third zones, either by scribing and cracking or by sawing, into a plurality of chips each of which contains one of said third zones, e. etching the chips using an etchant which does not remove gold but does remove the nickel from the parts of said junctions of each chip exposed at stage (c), the etchant further serving to etch the sawn or cracked edge of each chip, f. making contacts to the gold layers on the first, second and third zones.

2. A method of manufacturing thyristors, including the following steps:

a. forming in or on opposite sides of an N-type wafer P-type layers which are to act as the anodes and the gates respectively of a plurality of thyristors.

b. forming in or on the gate layers a plurality of N-type layers which are to act as the cathodes of the plurality of thyristors respectively, c. plating the wafer first with nickel and then with gold, d. removing the gold from at least part of the portion of each gate-cathode junction which is exposed at the surface of the wafer, e. dividing the wafer into a plurality of NPNP chips either by scribing and cracking or by sawing, f. etching the junctions between the original N-type wafer and the anodes and gates of each chip using an etchant which does not remove the gold but does remove the nickel from the gate-cathode junction of each chip, g. making contacts to the gold layers on the anode, cathode and gate.

3. A method as claimed in claim 2 in which step (b) is carried out by diffusion of N-type material selectively through a mask.

4. A method as claimed in claim 2 in which step (b) is carried out by diffusing N-type material into the P-type gate layer and then selectively etching to produce the required N-type layers.

5. A method as claimed in claim 1 including the step of increasing the P-concentration of the P-type gate layer between steps (b) and (c).

6. A method of manufacturing transistors, including the following steps:

a. forming in or on one side of a P-type wafer which is to act as the base of each transistor an N-type layer which is to act as the collector of each transistor, b. forming in or on the other side of the P-type wafer a plurality of N-type layers which are to act as the emitters of the plurality of transistors respectively, c. plating the wafer first with nickel and then with gold, d. removing the gold from at least part of the portion of each base-emitter junction which is exposed at the surface of the wafer, e. dividing the wafer into a plurality of NPN chips either by scribing and cracking or by sawing, f. etching the base-collector junctions using an etchant which does not remove gold but does remove the nickel from the base-emitter junction of each chip, g. making contacts to the gold layers on the base, collector and emitter.